(12) United States Patent
Song et al.

(10) Patent No.: US 9,972,414 B2
(45) Date of Patent: May 15, 2018

(54) ANISOTROPIC, TRANSPARENT, ELECTROCONDUCTIVE, AND FLEXIBLE THIN FILM STRUCTURE INCLUDING VERTICALLY ALIGNED NANOLINES AND METHOD FOR PREPARING SAME

(71) Applicant: KOREA RESEARCH INSTITUTE OF STANDARDS AND SCIENCE, Aaejeon (KR)

(72) Inventors: Jae Yong Song, Daejeon (KR); Sun Hwa Park, Seoul (KR); Hyun Min Park, Daejeon (KR)

(73) Assignee: KOREA RESEARCH INSTITUTE OF STANDARDS AND SCIENCE, Daejeon (KR)

( * ) Notice: Subject to any disclaimer, the term of this patent is extended or adjusted under 35 U.S.C. 154(b) by 438 days.

(21) Appl. No.: 14/648,545

(22) PCT Filed: Nov. 26, 2013

(86) PCT No.: PCT/KR2013/010764
§ 371 (c)(1),
(2) Date: May 29, 2015

(87) PCT Pub. No.: WO2014/084562
PCT Pub. Date: Jun. 5, 2014

(65) Prior Publication Data
US 2015/0318071 A1     Nov. 5, 2015

(30) Foreign Application Priority Data
Nov. 29, 2012   (KR) .................. 10-2012-0137061

(51) Int. Cl.
*H01B 1/22*      (2006.01)
*H01B 13/00*    (2006.01)
*H01L 31/18*     (2006.01)

(52) U.S. Cl.
CPC .......... *H01B 1/22* (2013.01); *H01B 13/0013* (2013.01); *H01L 31/1884* (2013.01); *Y02E 10/50* (2013.01); *Y10T 428/249921* (2015.04)

(58) Field of Classification Search
CPC ... H01B 1/22; H01B 13/0013; H01L 31/1884; Y10T 428/249921; Y02E 10/50
(Continued)

(56) References Cited

U.S. PATENT DOCUMENTS

2009/0052029 A1* 2/2009 Dai ................ B82Y 20/00
359/485.02
2009/0061170 A1* 3/2009 Fujikawa ........... H05K 3/4038
428/195.1

(Continued)

FOREIGN PATENT DOCUMENTS

CN      101468877 A      7/2009
CN      101901640 A      12/2010
(Continued)

*Primary Examiner* — Philip Tucker
*Assistant Examiner* — Vicki Wu
(74) *Attorney, Agent, or Firm* — Mayer & Williams PC; Stuart H. Mayer

(57) ABSTRACT

Provided is a method of preparing a thin film structure having anisotropic, transparent, electroconductive, flexible properties. The method of preparing a thin film structure includes providing a growth substrate; growing silver nanolines on the growth substrate by using a lightning-rod effect; molding the silver nanolines by using a polymer; and separating the silver nanolines molded by the polymer from the growth substrate to form a freestanding anisotropic, transparent, electroconductive, and flexible thin film.

10 Claims, 15 Drawing Sheets

(58) Field of Classification Search
USPC .......................................................... 156/246
See application file for complete search history.

(56) References Cited

U.S. PATENT DOCUMENTS

| | | | |
|---|---|---|---|
| 2009/0225310 A1* | 9/2009 | Yang .................... | G01N 21/658 356/301 |
| 2011/0206905 A1* | 8/2011 | Buriak .................... | B82Y 30/00 428/172 |
| 2012/0119117 A1* | 5/2012 | Fourkas ................. | B82Y 20/00 250/504 R |

FOREIGN PATENT DOCUMENTS

| | | |
|---|---|---|
| EP | 2477230 A2 | 7/2012 |
| KR | 1020080108734 | 12/2008 |
| KR | 1020090097533 | 9/2009 |
| KR | 1020100019297 | 2/2010 |
| KR | 1020100132932 | 12/2010 |

* cited by examiner

FIG. 17

| Solution | | σ (x 10⁻⁶ S cm⁻¹) | pH |
|---|---|---|---|
| DI water | | 1 | 5.74 |
| AgNO₃, 0.02mM | | 5 | 6.32 |
| AgNO₃, 0.02mM | NH₄OH, 0.26 mM | 18 | 9.25 |
| | NH₄OH, 0.79 mM | 30 | 9.72 |
| | NH₄OH, 1.32 mM | 35 | 9.92 |
| | NH₄OH, 2.11 mM | 48 | 10.07 |
| | H₂SO₄, 0.26 mM | 23 | 4.53 |
| | Na₂SO₄, 0.1 mM | 29 | 7.78 |
| | Na₂OH, 0.1 mM | 40 | 9.68 |
| | CH₃COONH₄, 1 mM | 105 | 6.52 |
| CuSO₄ 5H₂O, 0.05 mM | H₂SO₄, 0.026 mM | 23 | 4.37 |
| AgNO₃, 0.02mM CuSO₄ 5H₂O, 0.015 mM | H₂SO₄, 0.026 mM | 43 | 4.30 |
| HAuCl₄ 3.5H₂O, 0.045 mM | | 68 | 3.84 |

ANISOTROPIC, TRANSPARENT, ELECTROCONDUCTIVE, AND FLEXIBLE THIN FILM STRUCTURE INCLUDING VERTICALLY ALIGNED NANOLINES AND METHOD FOR PREPARING SAME

TECHNICAL FIELD

The inventive concept of the present invention relates to a thin film, and in particular, to an anisotropic, transparent, electroconductive, and flexible thin film structure and a method of preparing the same.

BACKGROUND ART

Transparent electrodes having optical transmittance and electroconductivity are used for flat panel display devices or light-emitting diode (LED) devices. Methods of forming a thin film to form such transparent electrodes have already been studied and commercially available. For example, transparent electrodes formed by depositing indium tin oxide (ITO) on a glass substrate have higher electroconductivity than when a conventional metal oxide is used, and accordingly, they are already commercially available for use as a transparent, electroconductive thin film electrode.

However, indium tin oxide (ITO) manufactured according to such a commercially available method needs to be deposited at high temperature. The high-temperature deposition and the need for indium result in high manufacturing costs. Also, due to its fragile properties, it is difficult to embody flexible electronic devices and select various materials to embody photoelectronic devices.

There have been efforts to use a roll-to-roll method to manufacture of flexible displays at low costs and in great quantities. To this end, flexible electrodes are required. In addition, a transparent electrode is required to have anisotropic and electroconductive properties to be suitable for fine pitch.

DETAILED DESCRIPTION OF THE INVENTION

Technical Problem

The inventive concept provides a thin film structure having anisotropic, transparent, electroconductive, and flexible properties.

The inventive concept also provides a method of preparing a thin film structure having anisotropic, transparent, electroconductive, and flexible properties.

However, these objects are an example only, and the inventive concept is not limited thereto.

Technical Solution

According to an aspect of the present invention, there is provided a method of preparing a thin film structure, wherein the method includes: providing a growth substrate; growing silver nanolines on the growth substrate by using a lightning-rod effect; molding the silver nanolines by using a polymer; and forming a freestanding anisotropic, transparent, electroconductive, and flexible thin film by separating the silver nanolines molded by the polymer from the growth substrate.

In some embodiments of the present invention, the molding of the silver nanolines by using the polymer may include: spraying a polymer solution including the polymer on the silver nanolines by spin coating to immerse at least a portion of the silver nanolines in the polymer solution; forming a molded structure by hardening the polymer solution to allow the polymer to mold the silver nanolines; and cooling the molded structure.

In some embodiments of the present invention, the polymer may include poly vinyl alcohol (PVA), and the polymer may be present in the range of 5 wt % to 15 wt % in the polymer solution.

In some embodiments of the present invention, the forming of the molded structure by hardening the polymer solution to allow the polymer to mold the silver nanolines is performed at a temperature of 20° C. to 100° C.

In some embodiments of the present invention, the method may further include, after the forming of the freestanding anisotropic, transparent, electroconductive, and flexible thin film, forming a thin film structure by attaching the freestanding anisotropic, transparent, electroconductive, and flexible thin film on a supporting substrate.

In some embodiments of the present invention, in the forming the thin film structure by attaching the freestanding anisotropic, transparent, electroconductive, and flexible thin film on a supporting substrate, the freestanding anisotropic, transparent, electroconductive, and flexible thin film may be attached on the supporting substrate while a vapor state is maintained.

In some embodiments of the present invention, the method may further include, after the attaching of the freestanding anisotropic, transparent, electroconductive, and flexible thin film on the supporting substrate, curing the freestanding anisotropic, transparent, electroconductive, and flexible thin film at a temperature of 20° C. to 75° C. to increase an adhesive force of the freestanding anisotropic, transparent, electroconductive, and flexible thin film.

In some embodiments of the present invention, the supporting substrate may be water-proof and may include a material that is not deformable at a temperature of 20° C. to 75° C.

In some embodiments of the present invention, a surface of the growth substrate may include a growth inducing layer that is capable of growing the silver nanolines.

In some embodiments of the present invention, the polymer may be transparent and flexible, and may have lower electroconductivity than the silver nanolines.

According to another aspect of the present invention, there is provided a thin film structure prepared by using the method described above, wherein the thin film structure may includes the silver nanolines that are vertically aligned and are molded by the polymer, and provides at least one property selected from anisotropic properties, transparency, electroconductivity, and flexibility.

Advantageous Effects

A thin-film structure 70 according to an inventive concept may include silver nanolines 20 molded by a polymer 30, and may have anisotropic, transparent, electroconductive, and flexible properties. The silver nanolines 20 provide anisotropic and electroconductive properties, and the polymer 30 provides transparent and flexible prosperities. Accordingly, the silver nanolines 20 may contribute to the maintenance of electric properties and the polymer 30 may contribute to the maintenance of optical properties.

The thin-film structure 70 according to the inventive concept may be formed by using a simple process. Also, due to the transparent and electroconductive properties, the thin-film structure 70 may be suitable for use as a transparent electrode, and due to the flexible property, the thin-film structure 70 may be suitable for a roll-to-roll method, which is used for low-cost and mass-production. Furthermore, due to the anisotropic property, the thin-film structure 70 may be suitable for a fine pitch.

These effects are an example only, and do not limit the scope of the present invention.

DESCRIPTION OF THE DRAWINGS

FIG. 17 shows a table showing electrical conductivity and pH values of an electrolytic solution.

EMBODIMENTS

Figure 1:
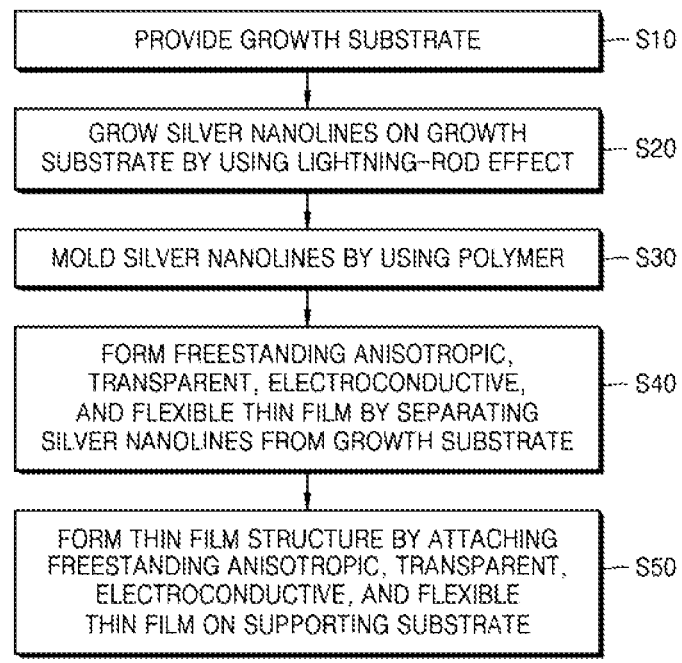
FIG. 1 shows a flowchart illustrating a method of preparing an anisotropic, transparent, electroconductive, and flexible thin film structure, according to an embodiment of the inventive concept.

Hereinafter, exemplary embodiments will be described more fully with reference to the accompanying drawings. These embodiments may be provided in many different forms and should not be construed as limited to the exemplary embodiments set forth herein. Rather, these embodiments are provided so that this disclosure will be thorough and complete, and will fully convey the scope of the invention to one of ordinary skill in the art. As used herein, the term "and/or" includes any and all combinations of one or more of the associated listed items. Like reference numerals may denote like elements throughout the specification. Various elements and regions in the drawings are schematically illustrated. Accordingly, the inventive concept is not limited by relative sizes or intervals illustrated in the attached drawings.

In the present specification, an anisotropic, transparent, electroconductive flexible thin film structure including silver nanolines will be described. However, such a thin film is an example only. For example, even when nanolines formed of other materials are included, the embodiment is included in the scope of the inventive concept.

Figure 7:
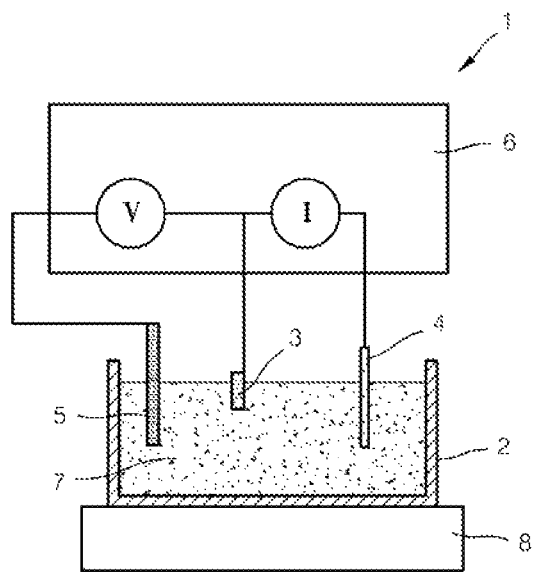
FIG. 7 shows schematic views of a silver nanoline forming device for forming silver nanolines included in an anisotropic, transparent, electroconductive, and flexible thin film structure.
Figure 8:
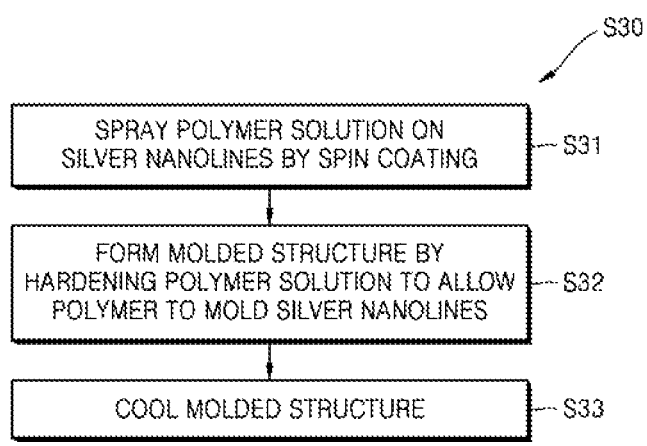
FIG. 8 shows a flowchart illustrating molding of silver nanolines by using a polymer in the method of preparing the anisotropic, transparent, electroconductive, and flexible thin film structure of FIG. 1 according to an embodiment of the inventive concept.

FIG. 1 shows a flowchart illustrating a method of preparing an anisotropic, transparent, electroconductive, and flexible thin film structure, according to an embodiment of the inventive concept. FIGS. 2 to 6 show schematic views illustrating a method of preparing the anisotropic, transparent, electroconductive, and flexible thin film structure of FIG. 1, according to an embodiment of the inventive concept. FIG. 7 shows schematic views of a silver nanoline forming device 1 for forming silver nanolines included in an anisotropic, transparent, electroconductive, and flexible thin film structure. FIG. 8 shows a flowchart illustrating molding of the silver nanolines by using a polymer in the method of preparing the anisotropic, transparent, electroconductive, and flexible thin film structure of FIG. 1 according to an embodiment of the inventive concept.

Referring to FIG. 1, a method of preparing an anisotropic, transparent, electroconductive, and flexible thin film structure (S1) according to an embodiment of the inventive concept includes providing a growth substrate (S10), growing silver nanolines on the growth substrate by using a lightning-rod effect (S20), molding the silver nanolines by using a polymer (S30); and separating the silver nanolines molded by the polymer from the growth substrate to form a freestanding anisotropic, transparent, electroconductive, and flexible thin film (S40). The method of preparing an anisotropic, transparent, electroconductive, and flexible thin film may further include attaching the freestanding anisotropic, transparent, electroconductive, and flexible thin film on a supporting substrate to form a thin-film structure 70 (S50).

Figure 2:
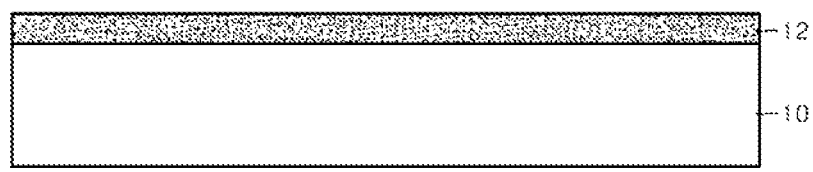
FIGS. 2 to 6 show schematic views illustrating a method of preparing the anisotropic, transparent, electroconductive, and flexible thin film structure of FIG. 1, according to an embodiment of the inventive concept.

Referring to FIGS. 1 and 2, a growth substrate 10 is provided (S10).

The growth substrate 10 may include a material that allows silver nanolines (20, see FIG. 3) to grow thereon. The growth substrate 10 may be, for example, a silicon wafer. The growth substrate 10 may have a surface having a growth inducing layer 12 formed of a material that allows silver nanolines (20, see FIG. 3) to grow thereon. The growth inducing layer 12 may include metal, for example, silver (Ag), silver alloy, gold (Au), or gold alloy.

Figure 3:
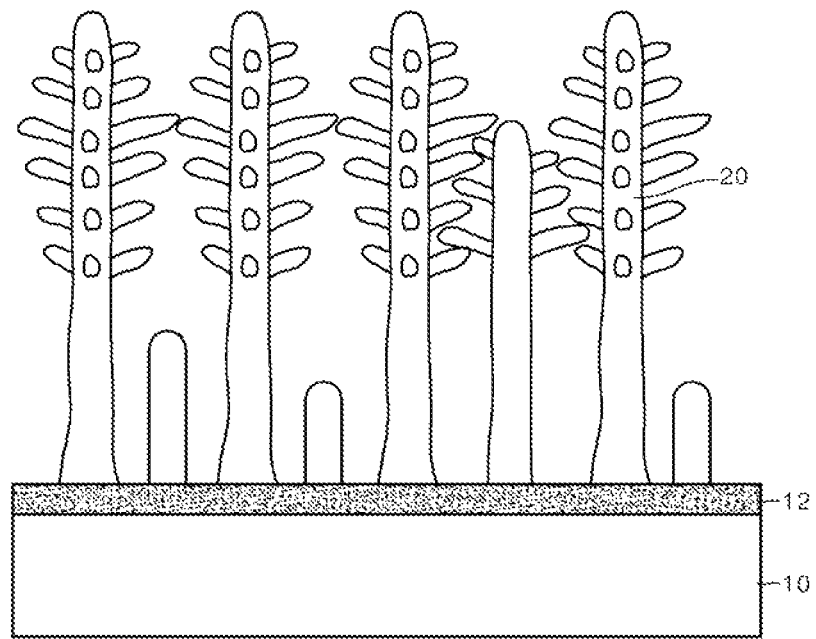

Referring to FIGS. 1 and 3, silver nanolines 20 are grown on the growth substrate 10 by using a lightning-rod effect (S20).

The operation (S20) may be performed by using the nanoline forming device 1 illustrated in FIG. 7. Referring to FIG. 7, the nanoline forming device 1 may include a 3-electrode system and a potentiostat.

The nanoline forming device 1 may include a vessel 2, a reference electrode 3, a counter electrode 4, a working electrode 5, and a potentiostat 6.

The vessel 2 may accommodate an electrolytic solution 7, and may be formed of a material that does not react with the electrolytic solution 7, for example, glass or stainless steel.

The reference electrode 3, the counter electrode 4, and the working electrode 5 may constitute a 3-electrode system. The reference electrode 3 may be, for example, a silver/silver chloride (Ag/AgCl) electrode. The counter electrode 4 may be, for example, a platinum (Pt) wire electrode. The working electrode 5 may be, for example, a substrate having conductivity. For example, the growth substrate 10 illustrated in FIG. 2, which may be manufactured by coating gold on a silicon wafer, may be used as the working electrode 5. The reference electrode 3, the counter electrode 4, and the working electrode 5 may be immersed in the electrolytic solution 7.

The potentiostat 6 may provide a current between the counter electrode 4 and the working electrode 5, and a voltage applied to the working electrode 5 may be measured while the reference electrode 3 is set to 0 V. Due to the potentiostat 6, from the electrolytic solution 7, a desired material may be deposited on the working electrode 5, thereby forming silver nanolines. The potentiostat 6 may change the amplitude and polarity of voltage applied to the working electrode 5. A polarization may be measured by using a potentiodynamic mode. The potentiodynamic mode may be performed, for example, at a frequency of 500 mHz, at a reduction voltage/oxidation voltage of −18 V/0.5 V, at a duty of 50%, and for a duration time of 4 hours. In the case of a 2-cell system, the potentiodynamic mode may be performed at a frequency of 500 mHz, at a reduction voltage/oxidation voltage of −40V/0.5V, at a duty of 50%, and for duration time of 4 hours.

The electrolytic solution 7 may be a solution in which a material for forming the silver nanolines 20 is dissolved, or may include a silver-containing aqueous solution. For example, the electrolytic solution 7 may be a mixed solution including about 0.02 mM $AgNO_3$ and about 2.11 mM $NH_4OH$.

The silver nanolines 20 may be grown on the growth substrate 10 by using a lightning-rod effect. The growth of the silver nanolines 20 will be described in detail. Silver nano particles are preferably nucleated on the working electrode 5 in the electrolytic solution 7, that is, on the growth substrate 10 of FIG. 2, thereby forming silver nano islands. At tips of the silver nano islands, an electric field is locally increased, and accordingly, interfacial anisotropy occurs. Due to the interfacial anisotropy, each of the silver nano islands grows into a silver nanoline. That is, once silver nano islands are nucleated, the speed of the growth behavior of silver nano islands is greater than the speed of the nucleation behavior, and as a result, the silver nanolines 20 grown in one direction are formed. The growth of the silver nanolines 20 is similar to lightning that is focused and flown on a lightning rod, which may thereby be called a lightning-rod effect. The silver nanolines 20 grown in one direction may provide anisotropic properties. The silver nanolines 20 may provide electroconductive properties due to metallic properties of silver.

The silver nanolines 20 may grow at an angle with respect to the growth substrate 10, for example, may be vertically grown with respect to the growth substrate 10. A diameter, a number density, and a length of the silver nanolines 20 may vary.

FIG. 3 illustrates the silver nanolines 20 of which shapes are similar to a dendritic shape. However, the shapes of the silver nanolines 20 are an example only, and the inventive concept is not limited thereto. For example, by controlling growth conditions for the silver nanolines 20, the silver nanolines 20 may be allowed to have a needle-shape, a plate-shape, or the like.

Figure 4:
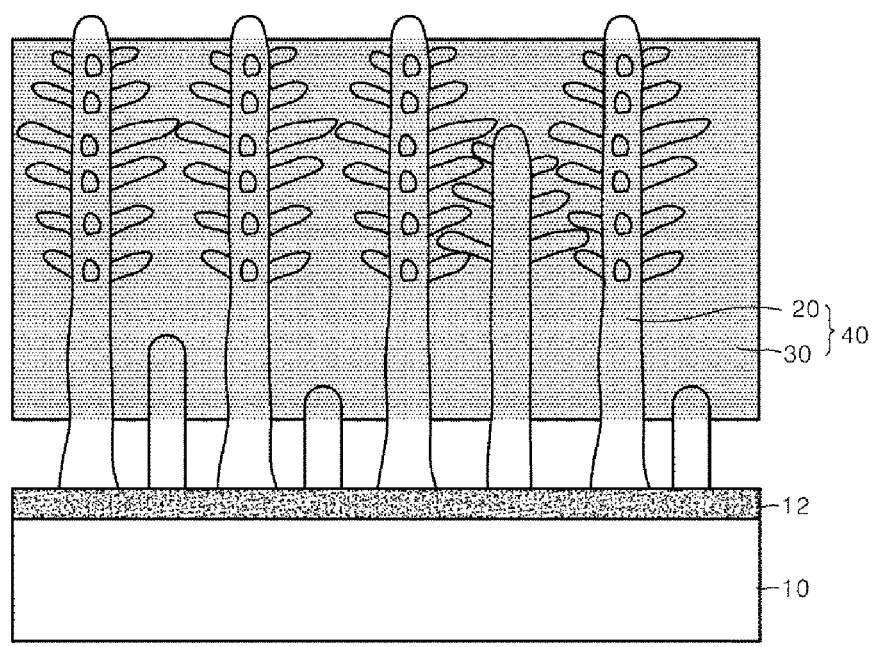

Referring to FIGS. 1 and 4, the silver nanolines 20 may be molded by using the polymer 30 (S30).

The polymer 30 may fill between the silver nanolines 20, and may mold the outside the silver nanolines 20. The polymer 30 may be a liquid, and may be provided in the form of a polymer solution that is solidified when hardened. The polymer 30 may include a flexible, transparent material, and may have a very low electroconductivity compared to the silver nanolines 20. The polymer 30 may include, for example, poly vinyl alcohol (PVA).

Referring to FIG. 8, the molding of the silver nanolines 20 by using the polymer 30 (S30) may include spraying a polymer solution including the polymer on the silver nanolines 20 by spin coating to immerse at least a part of the silver nanolines 20 in the polymer solution (S31), hardening the polymer solution to form a molded structure 40 in which the silver nanolins 20 are molded by the polymer 30 (S32), and cooling the molded structure 40 (S33).

The polymer solution may include, for example, about 5 wt % (weight ratio) to about 15 wt % of poly vinyl alcohol (PVA), or about 10 wt % of PVA, as the polymer 30. The polymer solution may be liquid or gel.

The spin coating may be performed, for example, for about 50 seconds to about 200 seconds and at a rotational speed of about 1000 rpm to about 2000 rpm. For example, the spin coating may be performed for about 100 seconds at a speed of about 1500 rpm. The spin coating may be performed once or a plurality of times. For example, the spin coating may be performed 5 times. However, the present embodiment is an example only, and the conditions for the spin coating may vary depending on the length and thickness of the silver nanolines 20. The spin coating may homogeneously provide the polymer 30 to the silver nanolines 20 on the growth substrate 10, and the polymer 30 may homogeneously fill between the silver nanolines 20.

The forming of the molded structure 40 by hardening the polymer solution to mold the silver nanolines 20 with the polymer 30 (S32), may be performed at a temperature of about 20° C. to about 100° C. The operation (S32) may be performed, for example, at room temperature (about 25° C.), or a temperature that is higher than the room temperature, for example, at a temperature of about 80° C. for one hour, or at a temperature of about 100° C. for hour. However, these embodiments are an example only, and the temperature, time, and count of the heat treatment may vary.

Figure 5:
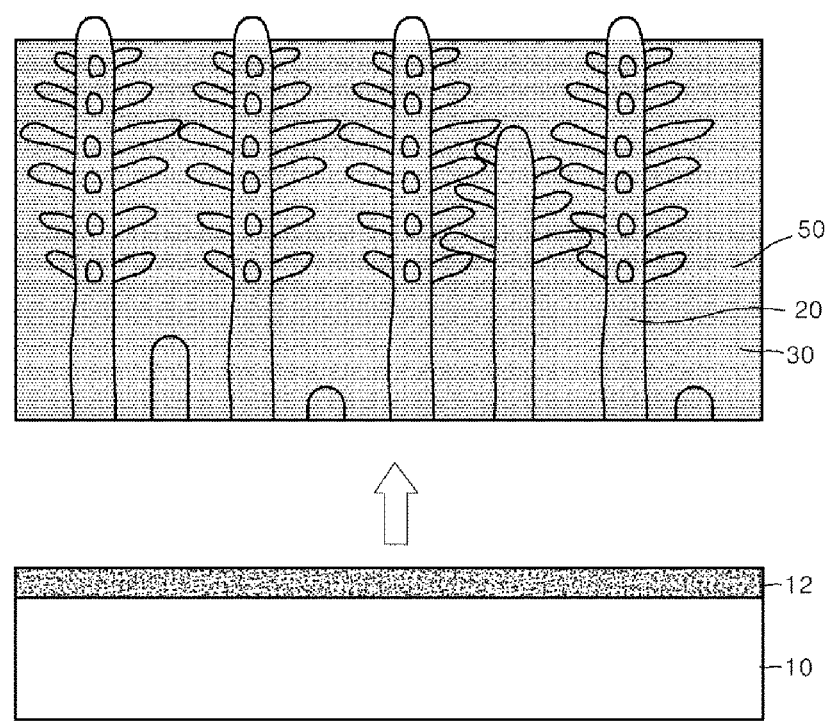

Referring to FIGS. 1 and 5, the silver nanolines 20 molded by the polymer 30, that is, the molded structure 40 is separated from the growth substrate 10 to form a freestanding anisotropic, transparent, electroconductive, and flexible thin film 50 (S40).

The freestanding anisotropic, transparent, electroconductive, and flexible thin film 50 may be formed by using the molded structure 40 of FIG. 4, and in detail, may be a thin film in which the silver nanolines 20 are located in the polymer 30 that is hardened.

The separating of the molded structure 40 from the growth substrate 10 may be performed by using a blade, a cutter, or a grinder. For example, the molded structure 40 may be separated from the growth substrate 10 by cutting using a blade or a cutter, or the growth substrate 10 may be separated and removed therefrom by polishing using a grinder.

Figure 6:
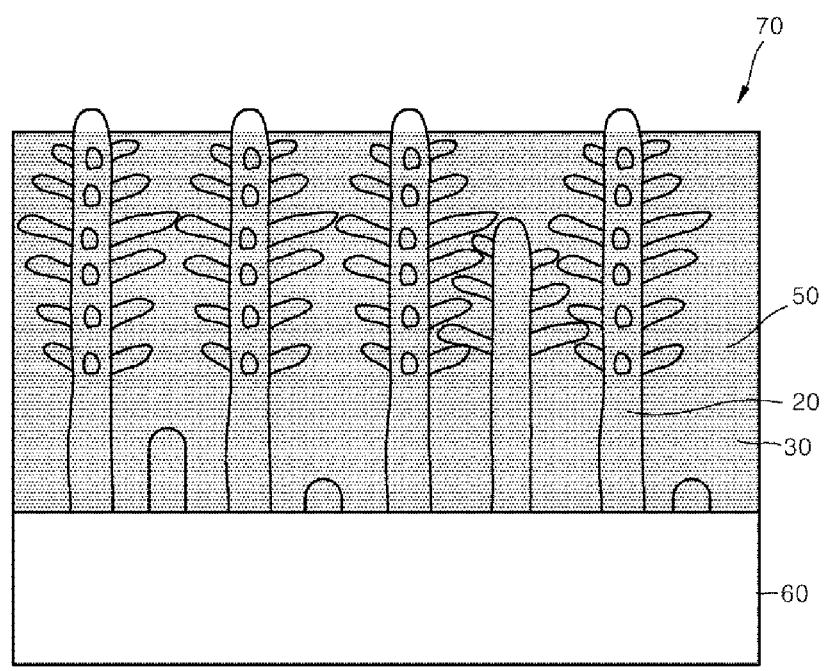

Referring to FIGS. 1 and 6, the freestanding anisotropic, transparent, electroconductive, and flexible thin film 50 is attached on a supporting substrate 60 to form the thin-film structure 70 (S50).

The attaching of the freestanding anisotropic, transparent, electroconductive, and flexible thin film 50 on the supporting substrate 60 may be embodied as below: distilled water is heated at a temperature of about 75° C., and vapor generated at this temperature is provided to the supporting substrate 60 for about 30 seconds, and while the vapor is maintained on the supporting substrate 60, the freestanding anisotropic, transparent, electroconductive, and flexible thin film 50 is attached on the supporting substrate 60.

To increase an adhesive force of the freestanding anisotropic, transparent, electroconductive, and flexible thin film 50, after the attaching of the freestanding anisotropic, transparent, electroconductive, and flexible thin film 50 on the supporting substrate 60, the freestanding anisotropic, transparent, electroconductive, and flexible thin film 50 may be cured at a temperature of about 20° C. to about 75° C. for about 1 minute to about 20 minutes, for example, for about 10 minutes.

The supporting substrate 60 may be water-proof and may include a material that is not deformable at a temperature of about 20° C. to about 75. For example, the supporting substrate 60 may include glass, quartz, plastic, metal, or metal oxide. The supporting substrate 60 may be transparent or semi-transparent, or non-transparent. For example, the supporting substrate 60 may be an indium-tin oxide (ITO) glass substrate.

The thin-film structure 70 according to the inventive concept may include the silver nanolines 20 molded by the polymer 30, and may have anisotropic, transparent, electroconductive, and flexible properties. The silver nanolines 20 may provide anisotropic and electroconductive properties, and the polymer 30 may provide transparent and flexible properties. Accordingly, the silver nanolines 20 may contribute to the maintenance of electric properties and the polymer 30 may contribute to the maintenance of optical properties.

Thus, the thin-film structure 70 according to the inventive concept may be formed by using a simple process. Also, due to the transparent and electroconductive properties, the thin-film structure 70 may be suitable for use as a transparent electrode, and due to the flexible property, the thin-film structure 70 may be suitable for a roll-to-roll method, which is used for low costs and mass-production. Furthermore, due to the anisotropic property, the thin-film structure 70 is suitable for a fine pitch.

Figure 9:
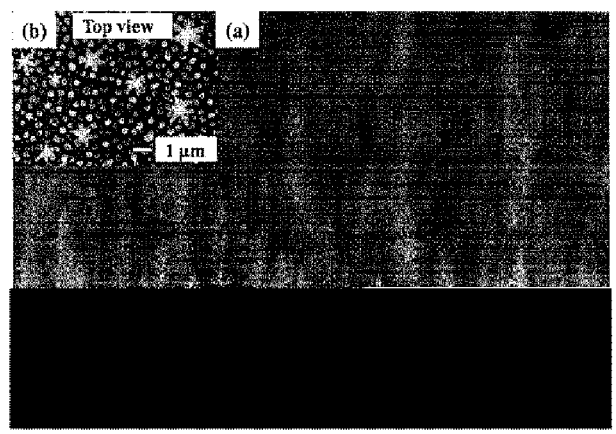
FIG. 9 shows scanning electron microscopic images of silver nanolines formed by using a method of preparing an anisotropic, transparent, electroconductive, and flexible thin film structure according to an embodiment of the inventive concept.

FIG. 9 shows scanning electron microscopic images of silver nanolines formed by using a method of preparing an anisotropic, transparent, electroconductive, and flexible thin film structure according to an embodiment of the inventive concept. FIG. 9A shows a scanning electron microscopic image of silver nanolines at an angle of 13 degrees, and FIG. 9B shows a top image of the silver nanolines.

Referring to FIG. 9, silver nanolines formed by using a lightning-rod effect are vertically grown. It may be seen that the silver nanolines are vertically aligned. The silver nanolines may be grown up to about 15 μm, and a diameter thereof may be in a range of 80 nm to 800 nm.

Figure 10:
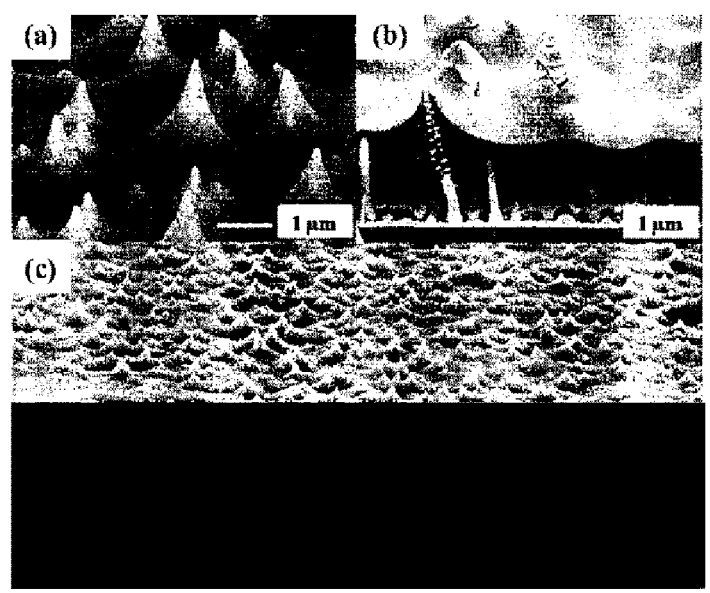
FIG. 10 shows scanning electron microscopic images of a molded structure formed by molding silver nanolines, which are formed by using an anisotropic, transparent, electroconductive, and flexible thin film structure according to an embodiment of the inventive concept, by using a polymer.

FIG. 10 shows scanning electron microscopic images of a molded structure prepared by molding silver nanolines, which are formed by using an anisotropic, transparent, electroconductive, and flexible thin film structure according to an embodiment of the inventive concept, by using a polymer. FIGS. 10A and 10C show images of the molded structure at an angle of 13 degrees, and FIG. 1B shows an image of a molded structure processed by using a focused ion beam (FIB).

FIG. 10 shows an image of a molded structure in which silver nanolines formed by a lightning-rod effect are immersed by using a polymer. A wave pattern of the surface may be constituted of tips of silver nanolines. Tips of the silver nanolines may protrude outside the polymer, and accordingly, the silver nanolines may be easily electrically connected to an external electrode. Accordingly, electric properties of the silver nanolines may be easily measured, and a thin film structure including the silver nanolines may be used for various purposes.

FIGS. 11 to 14 show graphs of optical properties and electric properties of an anisotropic, transparent, electroconductive, and flexible thin film structure according to an embodiment of the inventive concept.

Figure 11:
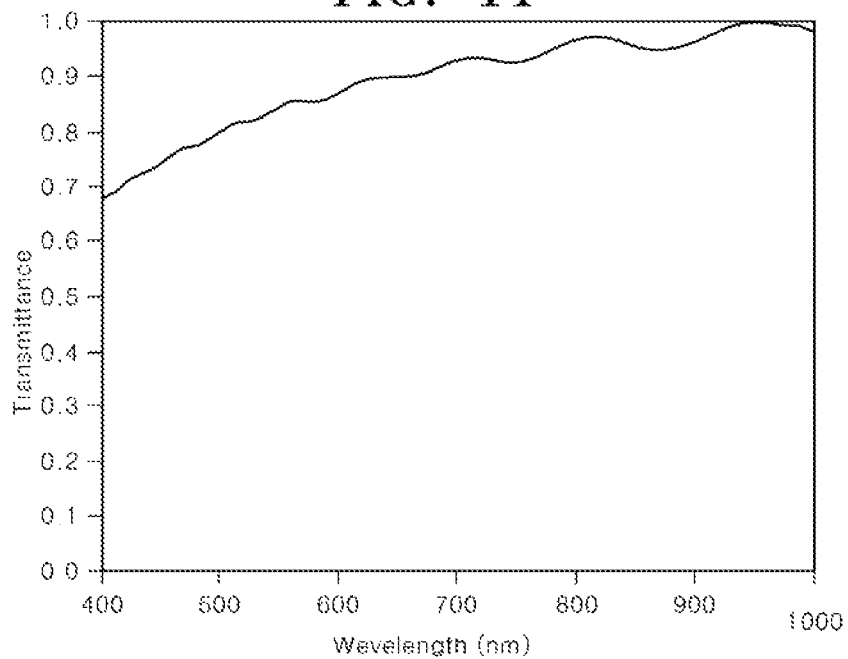
FIGS. 11 to 14 show graphs of optical properties and electric properties of an anisotropic, transparent, electroconductive, and flexible thin film structure according to an embodiment of the inventive concept.
Figure 12:
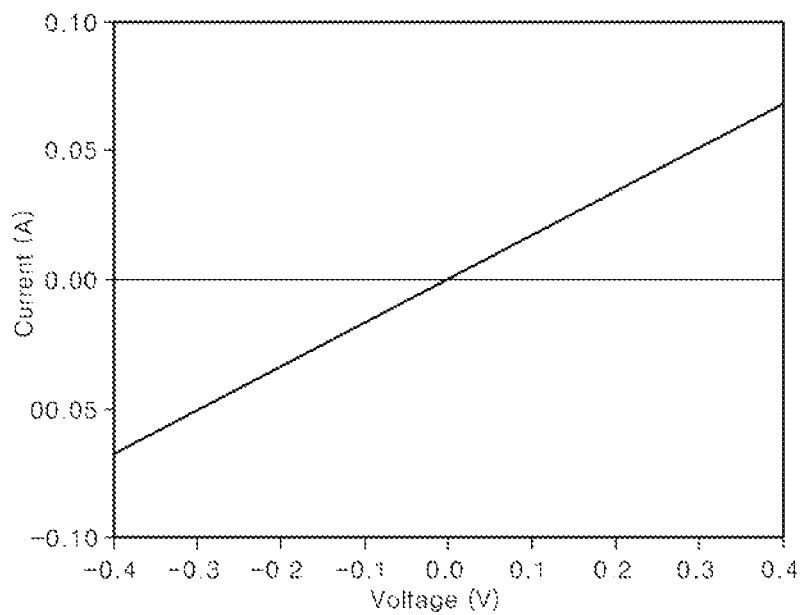
Figure 13:
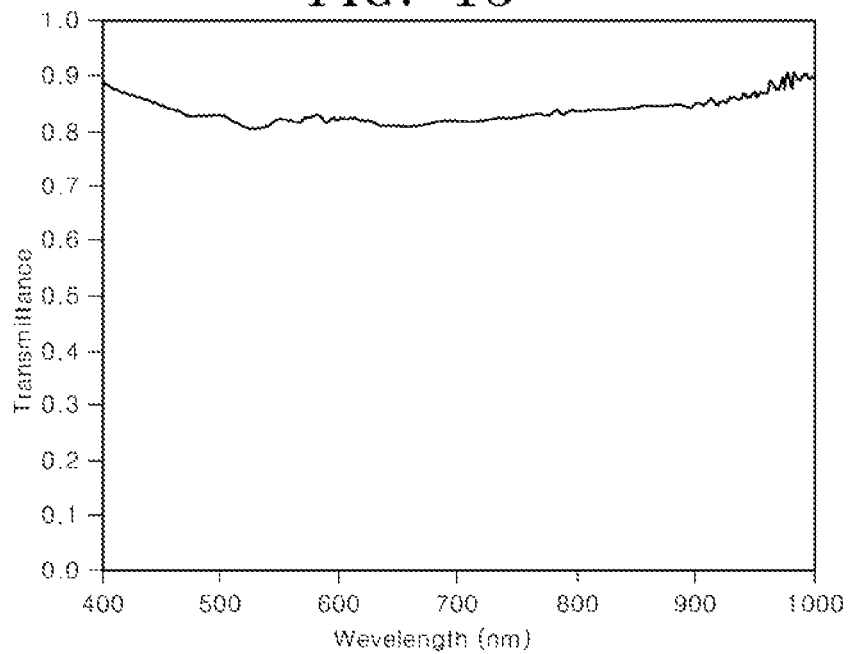
Figure 14:
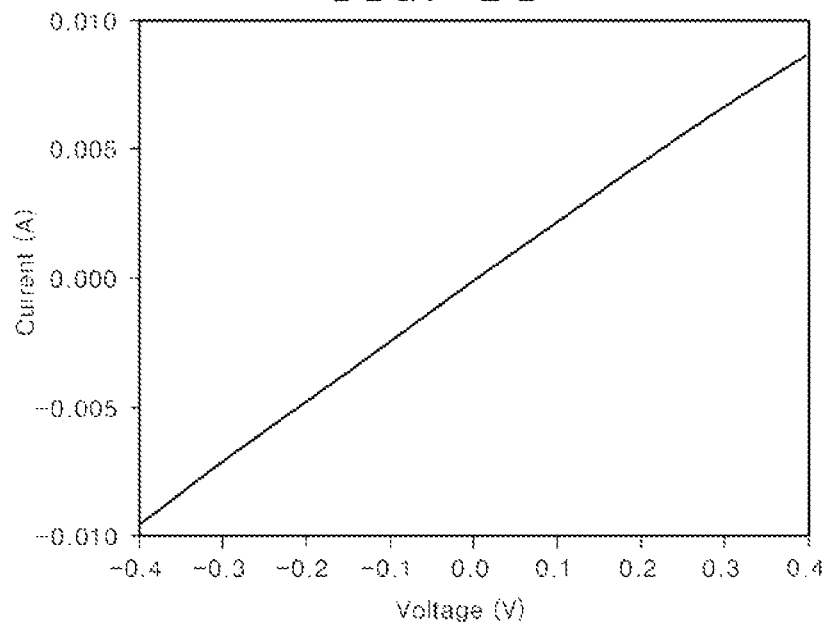

FIGS. 11 and 12 show graphs of transmittance and I-V properties of the freestanding anisotropic, transparent, electroconductive, and flexible thin film 50 of FIG. 5, respectively. FIGS. 13 and 14 show graphs of transmittance and I-V properties of the thin-film structure 70 of FIG. 6, respectively. FIG. 11 shows transmittance values measured with reference to a reference thin film in which a PVA layer is formed on a polyimide film by spin coating and curing. FIG. 13 shows transmittance values measured with reference to a reference thin film structure in which the reference thin film is attached on an indium-tin oxide glass substrate.

Referring to FIG. 11, the freestanding anisotropic, transparent, electroconductive, and flexible thin film 50 according to the inventive concept has a transmittance of about 0.7 or more with respect to light having a wavelength of 400 nm to 1000 nm. For example, with respect to light having a wavelength of 400 nm, the freestanding anisotropic, transparent, electroconductive, and flexible thin film 50 has a transmittance of about 0.68. When the freestanding anisotropic, transparent, electroconductive, and flexible thin film 50 has a greater wavelength, the transmittance thereof increases, and ultimately, with respect to light having a wavelength of 900 nm or more, the transmittance thereof is almost 1. Accordingly, compared to the reference thin film that does not include silver nanolines, the transmittance loss caused by the silver nanolines seems to be tolerable for use as a transparent electrode. Silver nanolines decrease transmittance. Accordingly, when the number of silver nanolines per unit area is reduced, transmittance may be increased.

Referring to FIG. 12, the graph of I-V properties of the freestanding anisotropic, transparent, electroconductive, and flexible thin film thin film 50 is linear. With reference to 0

V, a I-V properties plot for applying a positive potential is almost symmetry to a I-V properties plot for applying a negative potential. When 0.4 V is applied, the current is about 0.07 A, and when −0.4 V is applied, the current is about −0.07 A. When I-V properties is measured in a perpendicular direction, that is, a direction in which silver nanolines extend, a constant and low resistance is obtained, and for example, a resistance of about 5.7Ω(=0.8 V/0.14 A) may be obtained. When I-V properties are measured in a horizontal direction, like an insulator, the freestanding anisotropic, transparent, electroconductive, and flexible thin film thin film 50 shows a very high resistance.

Referring to FIG. 13, the thin-film structure 70 shows optical properties which are similar to those of the anisotropic, transparent, electroconductive, and flexible thin film 50. The thin-film structure 70 shows a transmittance of about 0.8 to about 0.9 with respect to light having a wavelength of 400 nm to 1000 nm. In detail, with respect to light having a wavelength of 400 nm, the thin-film structure 70 shows a transmittance of about 0.88. When the wavelength increases, the transmittance decreases, and when the wavelength of light is in a range of 500 nm to 900 nm, the transmittance is about 0.8. However, when the wavelength of light is 900 nm or more, the transmittance is increased to about 0.92. Compared to results of FIG. 11, when a thin film is attached on a supporting substrate, the transmittance thereof decreases. However, with respect to a wavelength, the transmittance is constant, and in particular, at a lower wavelength, the transmittance increases. Compared to the reference thin film structure that does not include silver nanolines, the transmittance loss caused by the silver nanolines seems to be tolerable for use as a transparent electrode.

Referring to FIG. 14, the thin-film structure 70 including the anisotropic, transparent, electroconductive, and flexible thin film 50 shows electric properties that are similar to those of the anisotropic, transparent, electroconductive, and flexible thin film 50. The graph of I-V properties of the thin-film structure 70 shows linear. With reference to 0 V, the I-V properties plot for applying a positive potential is almost symmetry to the I-V properties plot for applying a negative potential. When 0.4 V is applied, the current is about 0.009 A, and when −0.4 V is applied, the current is about −0.009 A. When I-V properties of a thin film structure are measured in a perpendicular direction, that is, a direction in which silver nanolines extend, a constant and low resistance is obtained, and for example, a resistance of about 44.4Ω(=0.8 V/0.018 A) may be obtained. When I-V properties of the thin film structure are measured in a horizontal direction, like an insulator, the thin film structure shows a very high resistance. The resistance in the vertical direction is greater than that of FIG. 12, which is because the thin film structure is measured while being attached on an indium-tin oxide glass substrate.

Figure 15:
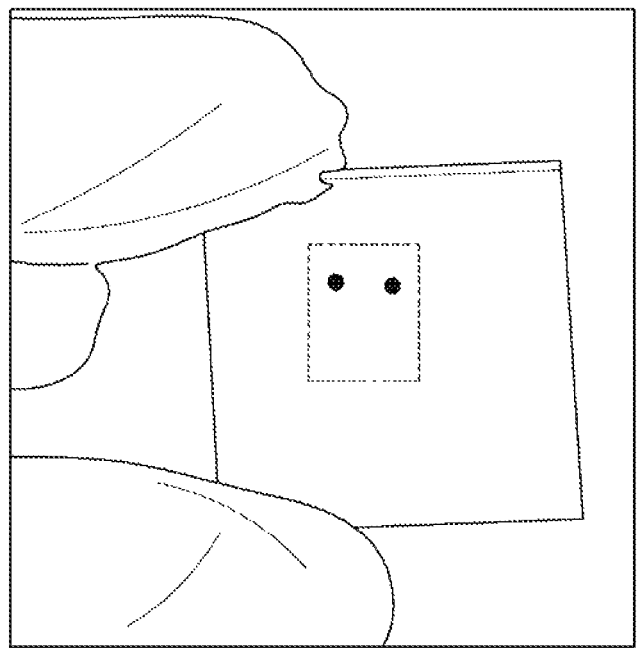
FIG. 15 shows an image of an anisotropic, transparent, electroconductive, and flexible thin film structure according to an embodiment of the inventive concept.

FIG. 15 shows an image of an anisotropic, transparent, electroconductive, and flexible thin film structure according to an embodiment of the inventive concept.

Referring to FIG. 15, an anisotropic, transparent, electroconductive, and flexible thin film is attached on red portions of the anisotropic, transparent, electroconductive, and flexible thin film structure. Accordingly, the anisotropic, transparent, electroconductive, and flexible thin film structure according to the inventive concept may provide anisotropic, transparent, electroconductive, and flexible properties.

Hereinafter, based on the descriptions provided above, growth mechanism of a nano structure including the silver nanolines and a method of preparing a nano structure will be described in detail with reference to Experimental Examples. That is, the growing of silver nanolines on the growth substrate illustrated in FIG. 1 by using a lightning-rod effect (S20) will be described in detail.

The "template" used herein refers to an object that provides a particular preferred growth orientation to a crystal material that grows thereon. The term "substrate" used herein refers to an object that does not provide a particular preferred growth orientation to a crystal material that grows thereon. The term "one-dimensional growth" used herein refers to a one-directional linear growth. The term "reduction voltage" used herein refers to a voltage that is applied in a direction in which electrons are provided to a substrate on which a nano structure grows. The term "oxidation voltage" used herein refers to a voltage that is applied in a direction in which electrons are removed from a substrate on which a nano structure grows. The direction in which the oxidation voltage is applied is opposite to the direction in which the reduction voltage is applied.

The present invention provides a method of preparing a vertically grown nano structure without use of a template. In detail, an interfacial anisotropy for the one-dimensional growth of a nano structure by using a water-containing solution having a highly diluted electrolyte (hereinafter, called a ultra-dilute solution), and a crystal material provided from an electrolyte is nucleated and grown on a conductive substrate to form nano structures that are filamentary, one-dimensional crystal grown in a perpendicular direction with respect to a surface of the conductive substrate.

Method of Preparing Nano Structure

Figure 16:
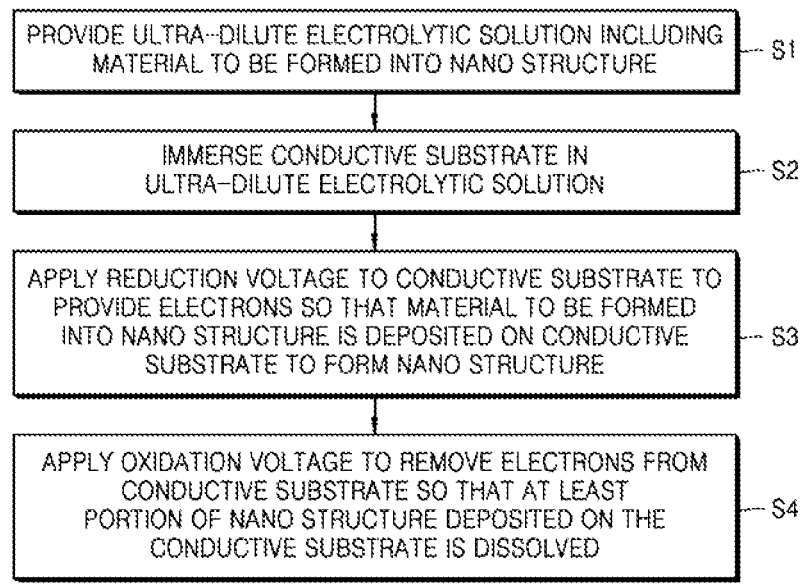
FIG. 16 shows a flowchart illustrating a method of preparing a nano structure according to an experimental example of the inventive concept.

FIG. 16 shows a flowchart illustrating a method of preparing a nano structure according to an embodiment of the inventive concept.

Referring to FIG. 16, the method of preparing a nano structure includes providing an ultra-dilute electrolytic solution including a material to be formed into a nano structure (S1); immersing a conductive substrate (that is, a working electrode) in the ultra-dilute electrolytic solution (S2); applying a reduction voltage to the conductive substrate to provide electrons so that the material to be formed into a nano structure is deposited on the conductive substrate to form a nano structure (S3); and applying an oxidation voltage to remove electrons from the conductive substrate so that at least a portion of the nano structure deposited on the conductive substrate is dissolved (S4).

The applying of the reduction voltage (S3) and the applying of the oxidation voltage (S4) may be alternately performed. For example, the applying of the reduction voltage (S3) and the applying of the oxidation voltage (S4) may be alternately performed at a frequency of, for example, 0.1 Hz to 10 Hz. However, the present embodiment is an example only, and the frequency may vary. In some embodiments, the applying of the oxidation voltage (S4) may be omitted.

As described above, the reduction voltage and the oxidation voltage may have opposite polarities. The reduction voltage may be in a range of, for example, 1 V to 30 V, for example, 3 V to 20 V. The oxidation voltage may be in a range of, for example, −0.01 V to −5 V, for example, 0.1 V to 1 V.

The ultra-dilute electrolytic solution may include the material to be formed into a nano structure in an amount of 0.001 mM to 0.5 mM. The material to be formed into a nano structure may include at least one selected from a silver-containing material, a gold-containing material, and a copper-containing material.

The ultra-dilute electrolytic solution may have, for example, an electrical conductivity of $1 \times 10^{-6}$ S cm$^{-1}$ to $105 \times 10^{-6}$ S cm$^{-1}$, or an electrical conductivity of $23 \times 10^{-6}$ S cm$^{-1}$ to $105 \times 10^{-6}$ S cm$^{-1}$.

The ultra-dilute electrolytic solution may include various auxiliary ion materials to change electric conductivity. The auxiliary ion material may not include the material to be formed into a nano structure. The auxiliary ion material may include, for example, at least one selected from NH$_4$OH, Na$_2$SO$_4$, H$_2$SO$_4$, NaOH, and CH$_3$COONH$_4$. The ultra-dilute electrolytic solution may include the auxiliary ion material in an amount of 0.1 mM to 10 nM. However, the kind and amount of the auxiliary ion material are an example only, and do not limit the scope of the inventive concept. The electrical conductivity and pH of the electrolytic solution 7 may be changed by the addition of the inclusion of the auxiliary ion material, and results are shown in FIG. 17.

The nano structure may include the material to be formed into a nano structure. The nano structure may have a diameter of 80 nm to 800 nm, and may have an aspect ratio of 2 to 10.

Electrochemical Analysis and Fine Structure Analysis of Nano Structure

The morphology of the nano structure was confirmed by using an electric field emission scanning electron microscope. The crystal structure of the nano structure was confirmed by using a bright field transmission electron microscopy (BFTEM), a high resolution transmission electron microscopy (HRTEM), or an energy dispersive X-ray spectroscopy (EDS).

A cyclic voltammogram was obtained by applying a voltage of −14 V to 2 V to an electrolytic solution by using a potentiodynamic electrochemical system at a scan speed of 50 mV/s.

The electrical conductivity and pH of the electrolytic solution was measured by using a conventional conductivity measurement system. Results thereof are shown in FIG. 17.

Formation of One-Dimensional Nano Structure

The inventive concept provides formation of a one-dimensional nano structure in an ultra-dilute electrolytic solution including a material to be formed into a nano structure in an amount of 0.001 mM to 0.5 mM, without use of a template or an interfacial activating agent.

One-dimensional nano structures are nucleated in the form of islands separated from each other on a conductive substrate in an ultra-dilute electrolytic solution. At tips of the nucleated islands, an electric field is locally enhanced, and accordingly, an interfacial anisotropy occurs. Due to the interfacial anisotropic, each of the islands grows. The growth is similar to the lightning focused on a lightning rod, and accordingly, may be indicated as a lightning-rod effect.

For a long time, in a non-equilibrium state, the growth of macro structures, such as facet-shaped crystal structures, needle-shaped crystal structures, dendrite-shaped crystal structures, and fractal-shaped crystal structures, has been a major project in the electrochemical field. The growth was understood in view of diffusion-limited aggregation (DLA) and Mullins-Sekerka morphology instability characteristics, and it was proved that an interface of a growing crystal structure is instable. When an interfacial anisotropy between a solid phase and a liquid phase is high, a dendritic growth that is branched having an orientation is known to have a priority. However, when an interfacial anisotropy between a solid phase and a liquid phase is low, a fractal growth that is randomly branched is known to have a priority. When a crystal structure is electric-deposited, electro-convection occurs, surrounding tips of a growing crystal structure. The electro-convection means that charges at the tips convect in a solution among thin branches. Accordingly, a local electric field at the tips is greater than the entire electric field of an electrolyte, thereby causing a lightning-rod effect as described above.

Growth Mechanism of One-Dimensional Nano Structure

Hereinafter, a growth mechanism of a one-dimensional nano structure formed according to a method of embodiments of the present invention will be described.

Silver receives electrons from an electrolytic solution due to a reduction voltage and are deposited on a conductive substrate, and the resultant silver deposit nucleates in the form of semi-spherical islands on the conductive substrate. Subsequently, at protruding tips of the semi-spherical islands, a filamentary one-dimensional growth occurs toward the electrolytic solution. The one-dimensional growth is due to the fact that an electric field is locally enhanced by an aspect ratio of islands inside a ultra-dilute electrolytic solution. That is like a lightning-rod effect that is focused on a protruding part of a lightning rod. An electric field enhancing factor ($\beta$) may satisfy Equation 1.

$$\beta \propto (1/\in_0 \in)(l/\rho) \quad \quad \quad \text{[Equation 1]}$$

(wherein $\in$ is a dielectric constant of an electrolytic solution, $\in_0$ is a dielectric constant of vacuum, l is a length of a nano structure, and $\rho$ is a diameter of a tip of a nano structure)

When the electric field enhancing factor ($\beta$) reaches a critical value ($\beta_c$), the growth tip of a nano structure may experience an excess voltage ($\eta$) which is rapidly increased, and surrounding the tip, a nucleation may newly occur. For example, in a constant-potential mode, when an aspect ratio of the nano structure is about 2 or more, nucleation may newly occur surrounding tips, causing branch growth or fractal growth.

To increase the aspect ratio of the nano structure, that is, to obtain a longer, thinner nano structure, the critical value ($\beta_c$) and the dielectric constant ($\in$) of an electrolytic solution need to increase. Since the dielectric constant ($\in$) of the electrolytic solution is overall proportional to a log ($\sigma$) of the electrolytic solution, the electrical conductivity ($\sigma$) needs to increase. For example, when 0.1 mM Na$_2$SO$_4$ auxiliary ion material is added to an electrolytic solution, the electrical conductivity of the electrolytic solution may be increased from $5 \times 10^{-6}$ S cm$^{-1}$ to $29 \times 10^{-6}$ S cm$^{-1}$, and the aspect ratio may be increased to 5. One-dimensional growth of the nano structure is driven by strong electric field-enhanced interfacial anisotropy at tips of deposits that have been nucleated into 3-dimensional islands. A method of preparing a nano structure according to the present invention may be indicated as a filamentary one-dimensional nanocrystal growth in an ultra-dilute electrolyte (FONGUE) process.

In a reverse pulse potentiodynamic mode in which a reduction voltage and an oxidation voltage are alternately applied, during nucleation, islands of nano structures may be formed in a uniform size. Since the islands are not simultaneously formed on the entire surface of the conductive substrate, the diameter distribution ($\Delta$d) of islands having a diameter (d) is determined during one reverse pulse of oxidation-reduction cycle at a nucleation density (N). The nucleation density (N) may satisfy Equation 2.

$$N = N_s[1 - \exp(-R_n t)] \quad \quad \quad \text{[Equation 2]}$$

(wherein $N_s$ is a density of a nucleus during saturation, $R_n$ is a nucleation speed, and t is a reduction time)

The relationship between a nucleation speed ($R_n$) and excess voltage ($\eta$) satisfies Equation 3.

$$R_n \propto \exp(-1/\eta^2) \quad \text{[Equation 3]}$$

(wherein $R_n$ is a nucleation speed and $\eta$ is an excess voltage)

Figure 18:
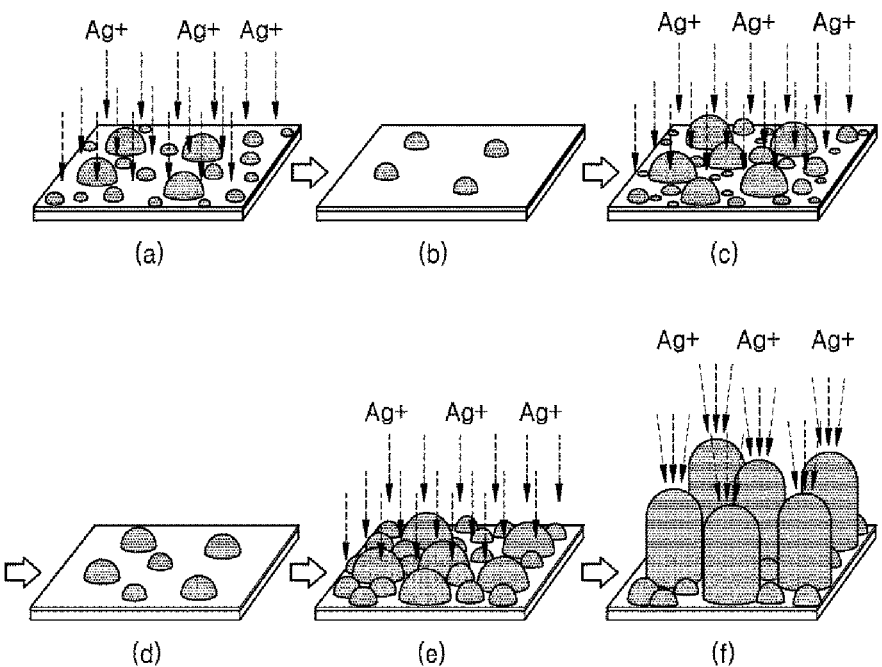
FIG. 18 shows a schematic view showing the growth behavior of a nano structure prepared by using a reverse pulse potentiodynamic mode in a method of preparing a nano structure according to the inventive concept.

FIG. 18 shows a schematic view showing the growth behavior of a nano structure prepared by using a reverse pulse potentiodynamic mode in a method of preparing a nano structure according to the inventive concept.

FIG. 18 shows the growth behavior of a nano structure. Referring to FIG. 14A, due to the applying of a reduction voltage, fine nuclei having an average diameter ($d_a$) and diameter distribution ($\Delta d$) are distributed on a conductive substrate. The nucleation is not affected by surface diffusion, but by a precursor flux that is driven by an electric field and arrives the surface of the conductive substrate. This is because random diffusion length of silver atoms on the surface of the conductive substrate is long. For example, at 298K, when a diffusion coefficient is $1.4 \times 10^{-6}$ cm$^2$/s and a reduction time is 0.1 second (that is, frequency is 5 Hz), a diffusion length is about 7 µm.

Referring to FIG. 18B, due to the applying of a reverse pulse of an oxidation voltage, nuclei having a diameter that is smaller than a critical diameter ($d_c$) may be dissolved and removed, and on the other hand, nuclei having a diameter that is greater than a critical size ($d_c$) may remain.

Referring FIG. 18C, due to the applying of the reduction voltage, the remaining nuclei grow, and new nuclei are nucleated and grown between the remaining nuclei on the conductive substrate. Compared to the remaining nuclei, newly formed nuclei grow fast. This is because the growth speed of a nucleus is in reverse proportional to the size thereof. Accordingly, compared to FIG. 18A, the density of nuclei having a diameter that is equal to or greater than the critical diameter ($d_c$) may increase.

Referring to FIG. 18D, due to the applying of a reverse pulse of an oxidation voltage, nuclei having a diameter that is smaller than the critical diameter ($d_c$) may be dissolved and removed, and on the other hand, nuclei having a diameter that is greater than a critical size ($d_c$) may remain. Compared to FIG. 18B, the density of the remaining nuclei is increased.

Subsequently, due to the alternate applying of a reduction voltage and an oxidation voltage, the reduction process and the oxidation processes are repeatedly performed, and the nucleation and dissolving explained in connection with FIGS. 18A to 18D are repeatedly performed.

Referring to FIG. 18E, due to the repeatedly performing reduction and oxidation processes, the islands of the nano structure may occur on the entire conductive substrate, and a monomodal distribution of the islands of the conductive substrate may be promoted. The islands may have a relatively uniform size. When the nucleation finishes, nuclei having a saturation diameter ($d_s$) and a saturation density ($N_s$) are formed.

The saturation diameter ($d_s$) and the saturation density ($N_s$) may be determined by competition between the nucleation speed ($R_n$) and the growth speed ($R_g$) during one reverse pulse (that is, reduction and oxidation processes) before the nucleation is saturated. For example, when the nucleation speed ($R_n$) is greater than the growth speed ($R_g$), the nucleation dominates, thereby being saturated with smaller nuclei, and the formed nuclei have a greater saturation density ($N_s$) and a smaller saturation diameter ($d_s$). On the other hand, when the growth speed ($R_g$) is greater than the nucleation speed ($R_n$), the growth of nuclei dominates, thereby being saturated with larger nuclei, and the formed nuclei has a smaller saturation density ($N_s$) and a greater saturation diameter ($d_s$).

These results show that the saturation diameter of islands that nucleate and grow is controllable by the diameter distribution ($\Delta d$) and average diameter ($d_a$) of nuclei that are formed during one reverse pulse. The diameter of a nano structure may vary, and may be, for example, in a range of 80 nm to 800 nm. The saturation diameter ($d_s$) may be controlled by changing a frequency, a reduction voltage, and electrical conductivity of an electrolytic solution, which will be described in detail later.

Referring to FIG. 18F, nuclei having the saturation diameter ($d_s$) and the saturation density ($N_s$) continuously, one-dimensionally grow, retaining the saturation diameter ($d_s$) or a diameter similar thereto, to form a one-dimensional nano structure. This shows that lateral growth of the one-dimensional nano structure is effectively suppressed, and the suppression of the lateral growth is associated with electro-convection between nano structures that consume cations in the space.

Figure 19:
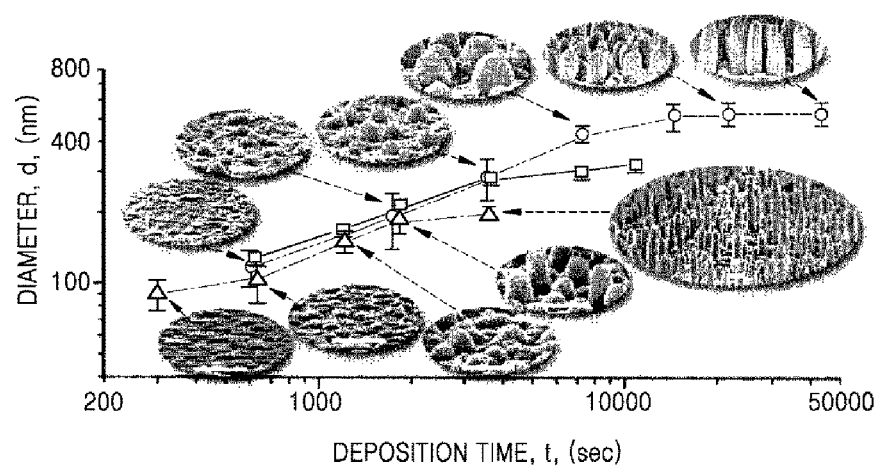
FIG. 19 shows the relationship between a deposition time and a diameter of a silver nano structure which is grown by using a reverse pulse potentiodynamic mode in a method of preparing a nano structure according to the inventive concept, and scanning electron microscopic images of the silver nano structure.

FIG. 19 shows the relationship between a deposition time and a diameter of a silver nano structure which is grown by using a reverse pulse potentiodynamic mode in a method of preparing a nano structure according to the inventive concept, and scanning electron microscopic images of the silver nano structure.

Referring to FIG. 19, the diameter of a nano structure shows an S-shaped curved behavior with respect to log (t). Also, this experimentally proves that the saturation diameter of a nano structure that nucleates and grows is controllable by the diameter distribution ($\Delta d$) and average diameter ($d_a$) of nuclei that are formed during one reverse pulse.

Growth Behavior of One-Dimensional Nano Structure with Respect to Frequency

Referring to FIG. 19, it may be seen that the saturation diameter of a nano structure varies depending on frequency. In FIG. 19, the circle indicates a value of a nano structure that was grown at a frequency of 0.25 Hz, the rectangle indicates a value of a nano structure that was grown at a frequency of 0.5 Hz, a regular triangle indicates a value of a nano structure that was grown at a frequency of 1 Hz, and the inverted triangle indicates a value of a nano structure that was grown at a frequency of 5 Hz. It may be seen that the lower frequency, the smaller saturation diameter the nano structure has.

Figure 20:
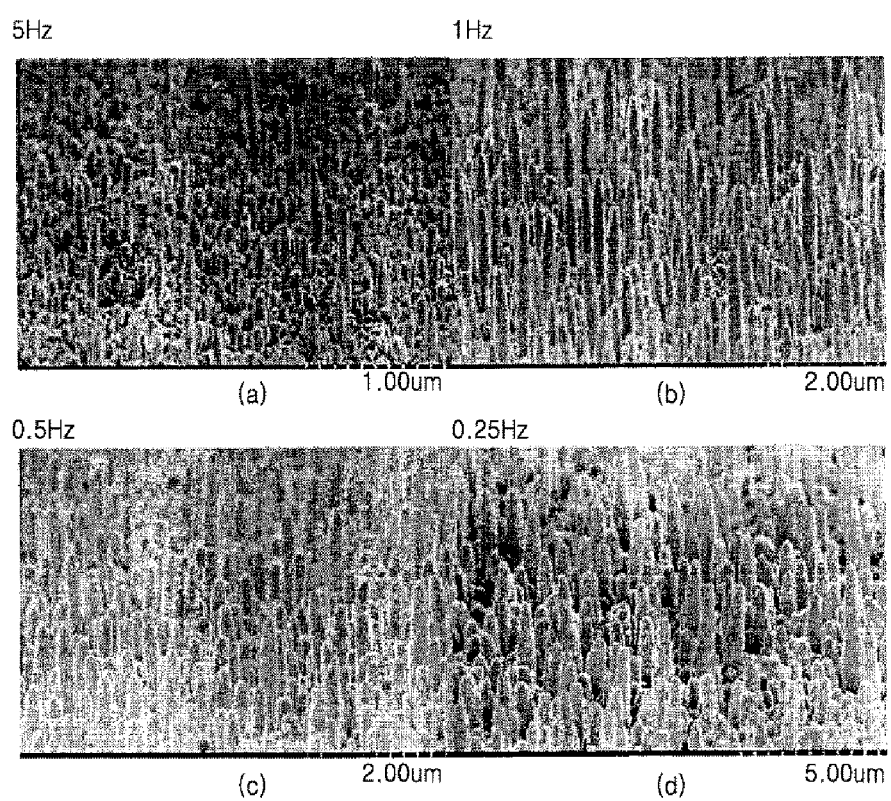
FIG. 20 shows scanning electron microscopic images showing the growth behavior of a silver nano structure with respect to frequency, the silver nano structure being prepared by using a reverse pulse potentiodynamic mode in a method of preparing a nano structure according to the inventive concept.

FIG. 20 shows scanning electron microscopic images showing the growth behavior of a silver nano structure with respect to frequency, the silver nano structure being prepared by using a reverse pulse potentiodynamic mode in a method of preparing a nano structure according to the inventive concept.

In FIG. 20, (a) shows an image of the silver nano structure at the frequency of 5 Hz (t is 20 minutes), (b) shows an image of the silver nano structure at the frequency of 1 Hz (t is 65 minutes), (c) shows an image of the silver nano structure at the frequency of 0.5 Hz (t is 3 hours), and (d) shows an image of the silver nano structure at the frequency of 0.25 Hz (t is 12 hours). The silver nano structures were deposited using an electrolytic solution including 0.02 mM AgNO$_3$.

Referring to FIGS. 19 and 20, when the frequency decreases (that is, approaching 0.25 Hz), a deposition time (t) for saturation increases and the diameter of the nano structure increases. In the case the frequency is 0.25 Hz, after 6 hours, saturation occurred with a saturation diameter ($d_s$) of 520 nm. In the case the frequency is 0.5 Hz, after 1 hour, saturation occurred with a saturation diameter ($d_s$) of 330 nm. In the case the frequency is 1 Hz, after 30 minutes, saturation occurred with a saturation diameter ($d_s$) of 200 nm. In the case the frequency is 5 Hz, after 20 minutes, saturation occurred with a saturation diameter ($d_s$) of 80 nm.

A smaller frequency may have a reduction and oxidation cycle having a longer reduction time and a long oxidation time. When the reduction time prolongs, the average size ($d_a$) and the diameter distribution ($\Delta d$) increase. On the other hand, when the oxidation time prolongs, islands are more dissolved, and ultimately, the critical size ($d_c$) increases. When the frequency increases, the average size ($d_a$) and the diameter distribution ($\Delta d$) decrease and the critical size ($d_c$) decreases.

Figure 21:
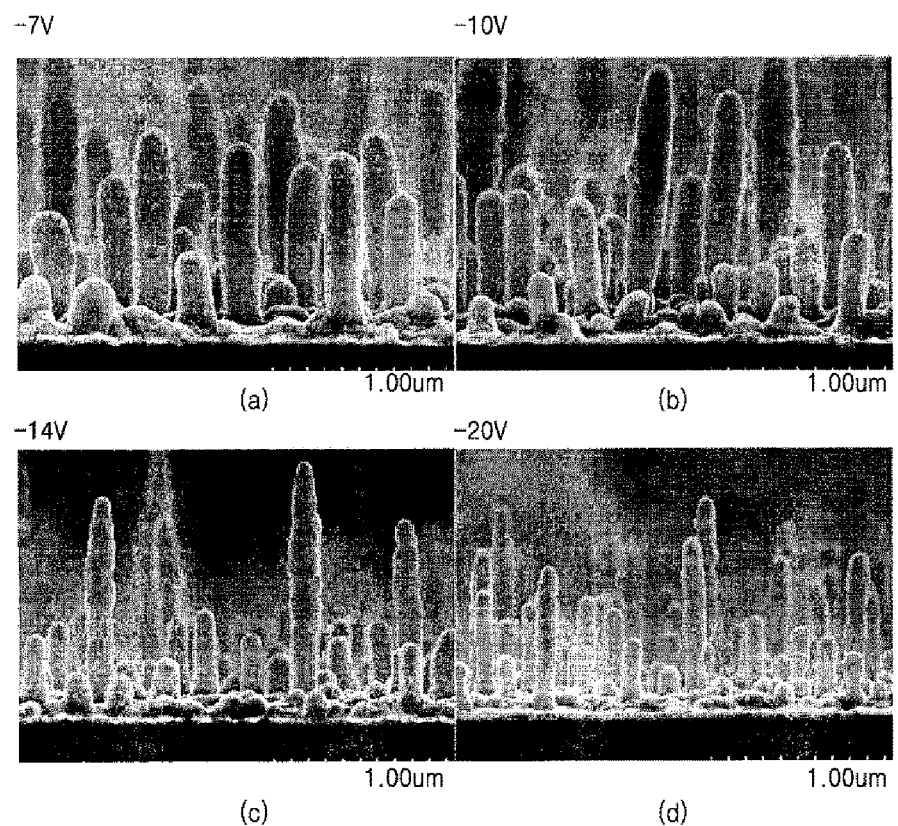
FIG. 21 shows scanning electron microscopic images showing the growth behavior of a silver nano structure with respect to reduction voltage, the silver nano structure being prepared by using a reverse pulse potentiodynamic mode in a method of preparing a nano structure according to the inventive concept.

Growth Behavior of One-Dimensional Nano Structure with Respect to Reduction Voltage FIG. 21 shows scanning electron microscopic images showing the growth behavior of a silver nano structure with respect to reduction voltage, the silver nano structure being prepared by using a reverse pulse potentiodynamic mode in a method of preparing a nano structure according to the inventive concept.

In FIG. 21, (a) shows the case of 7 V (t is 2 hours and 30 minutes), (b) shows the case of 10 V (t is 1 hour and 40 minutes), (c) shows the case of 14 V (t is 1 hour), and (d) shows the case of 20 V (t is 1 hour). The silver nano structure was deposited using an electrolytic solution including 0.02 mM $AgNO_3$ and 1.32 mM $NH_4OH$. In all cases, the frequency was fixed to 1 Hz.

Referring to FIG. 21, when the reduction voltage was increased from 7 V to 20 V, the average diameter ($d_a$) of the nano structure was linearly reduced from 270 nm to 140 nm.

In the case the reduction voltage increases, during a reduction cycle, the average diameter ($d_a$) and the diameter distribution ($\Delta d$) may be increased. However, the increased reduction voltage leads to an increase in excess voltage ($\eta$), thereby causing change in the average diameter ($d_a$) and the diameter distribution ($\Delta d$). As described above, the average diameter ($d_a$) and the diameter distribution ($\Delta d$) of the nano structure may be changed by the competition between the nucleation speed ($R_n$) and the growth speed ($R_g$) during one reverse pulse. The nucleation speed ($R_n$) may be controllable by changing the reduction voltage, and as shown in Equation 3, the nucleation speed is proportional to $\exp(-1/\eta^2)$. On the other hand, the growth speed ($R_g$) is proportional to the excess voltage ($\eta$). Accordingly, when the excess voltage ($\eta$) increases, the nucleation speed ($R_n$) increases at a greater rate than the growth speed ($R_g$), and nucleation occurs more, and the surface of the conductive substrate may be sufficiently covered by uniform and smaller nuclei.

Figure 22:
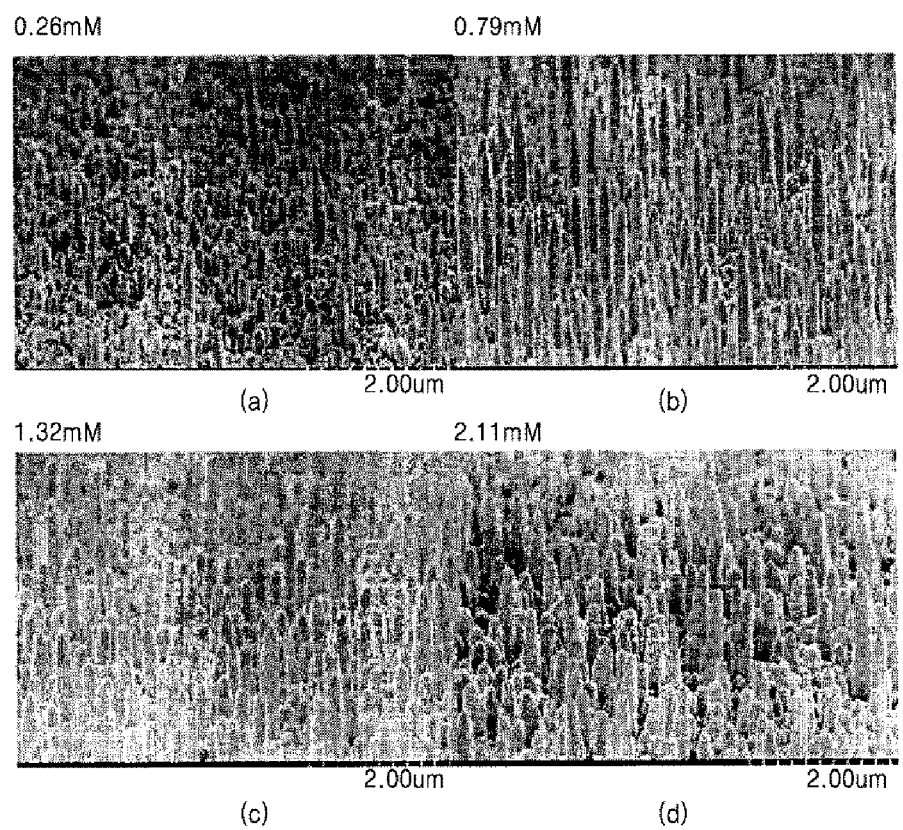
FIG. 22 shows scanning electron microscopic images showing the growth behavior of a silver nano structure with respect to electrical conductivity of an electrolytic solution, the silver nano structure being prepared by using a reverse pulse potentiodynamic mode in a method of preparing a nano structure according to the inventive concept.

Growth Behavior of One-Dimensional Nano Structure with Respect to Electrical Conductivity FIG. 22 shows scanning electron microscopic images showing the growth behavior of a silver nano structure with respect to electrical conductivity of an electrolytic solution, the silver nano structure being prepared by using a reverse pulse potentiodynamic mode in a method of preparing a nano structure according to the inventive concept.

Referring to FIG. 22, the electrical conductivity of the electrolytic solution was changed by adding an auxiliary ion material, and the auxiliary ion material was $NH_4OH$. In FIG. 22, (a) shows the case of 0.26 mM $NH_4OH$ (t is 1 hour), (b) shows the case of 0.79 mM $NH_4OH$ (t is 1 hour), (c) shows the case of 1.32 mM $NH_4OH$ (t is 2 hours), and (d) shows the case of 2.11 mM $NH_4OH$ (t is 2 hours). In all of the cases, the frequency was fixed to 1 Hz.

Referring to FIG. 22, when the concentration of $NH_4OH$ increases from 0.26 mM to 2.11 mM, the electrical conductivity of the electrolytic solution increases from $18 \times 10^{-6}$ S $cm^{-1}$ to $48 \times 10^{-6}$ S $cm^{-1}$, and the diameter of the silver nano structure increases from 190 nm to 330 nm. When the electrical conductivity of the electrolytic solution increases, the diameter of the nano structure increases.

To change the electrical conductivity of the electrolytic solution, an auxiliary ion material may be added to the electrolytic solution. The auxiliary ion material may be, for example, $NH_4OH$, $H_2SO_4$, NaOH, $Na_2SO_4$, or $CH_3COONH_4$, but is not limited thereto When the electrical conductivity of the electrolytic solution increases, the nucleation speed ($R_n$) and the growth speed ($R_g$) decreases together. Accordingly, the average diameter ($d_a$) and diameter distribution ($\Delta d$) of the formed nuclei may decrease. This is because the auxiliary ion material added to increase the electrical conductivity is not involved in the reduction reaction for deposition. In fact, the auxiliary ion material may carry most current in the electrolytic solution. This is because the concentration of the auxiliary ion material is relatively higher than the concentration of silver (Ag) that is an electroactive precursor ion. Accordingly, the auxiliary ion material reduces an electric resistance of the electrolytic solution. On the other hand, with respect to the reduction reaction, the auxiliary ion material may be electrically nonelectroactive. Due to the addition of the auxiliary ion material to the electrolytic solution, the nucleation speed ($R_n$) may be lower than the growth speed ($R_g$), and accordingly, the growth of nucleus may dominate. Accordingly, the surface of the conductive substrate is covered by larger nuclei, and the saturation diameter ($d_s$) of the nano structure increases and the saturation density ($N_s$) of the nano structure decreases.

In conclusion, when the electrical conductivity of the electrolytic solution increases, the growth of nucleus dominates, and the nano structure may have a greater saturation diameter ($d_s$), and accordingly, a nano structure having a greater diameter may be embodied. Herein, the increase in electrical conductivity caused by the addition of the auxiliary ion material to the electrolytic solution may lead to a loss of the lightning-rod effect. Accordingly, the electrical conductivity of the electrolytic solution needs to be controlled within an optimal range. The electrical conductivity of the electrolytic solution may be in a range of, for example, $1 \times 10^{-6}$ S $cm^{-1}$ to $105 \times 10^{-6}$ S $cm^{-1}$. When the electrical conductivity is in the range of $23 \times 10^{-6}$ S $cm^{-1}$ to $105 \times 10^{-6}$ S $cm^{-1}$, a silver nano structure having an aspect ratio of 5 to 8 may be embodied, which may not be associated with the kind of the auxiliary ion material.

While the inventive concept has been particularly shown and described with reference to exemplary embodiments thereof and attached drawings, it will be understood by those skilled in the art that various changes in form and details may be made therein without departing from the spirit and scope of the invention.

The invention claimed is:

1. A method of preparing a thin film structure, the method comprising:
   providing a growth substrate;
   growing silver nanolines on the growth substrate by using a lightning-rod effect;
   molding the silver nanolines by using a polymer; and
   forming a freestanding anisotropic, transparent, electroconductive, and flexible thin film by separating the silver nanolines molded by the polymer from the growth substrate.

2. The method of claim 1, wherein the molding of the silver nanolines by using the polymer comprises:

spraying a polymer solution including the polymer on the silver nanolines by spin coating to immerse at least a portion of the silver nanolines in the polymer solution;

forming a molded structure by hardening the polymer solution to allow the polymer to mold the silver nanolines; and cooling the molded structure.

3. The method of claim 2, wherein the polymer comprises poly vinyl alcohol (PVA), and the polymer is present in the range of 5 wt % to 15 wt % in the polymer solution.

4. The method of claim 2, wherein the forming of the molded structure by hardening the polymer solution to allow the polymer to mold the silver nanolines is performed at a temperature of 20° C. to 100° C.

5. The method of claim 1, further comprising, after the forming of the freestanding anisotropic, transparent, electroconductive, and flexible thin film, forming a thin film structure by attaching the freestanding anisotropic, transparent, electroconductive, and flexible thin film on a supporting substrate.

6. The method of claim 5, wherein in the forming the thin film structure by attaching the freestanding anisotropic, transparent, electroconductive, and flexible thin film on a supporting substrate, the freestanding anisotropic, transparent, electroconductive and flexible thin film is attached on the supporting substrate while a vapor state is maintained.

7. The method of claim 5, further comprising after the attaching of the freestanding anisotropic, transparent, electroconductive, and flexible thin film on the supporting substrate, curing the freestanding anisotropic, transparent, electroconductive, and flexible thin film at a temperature of 20° C. to 75° C. to increase an adhesive force of the freestanding anisotropic, transparent, electroconductive, and flexible thin film.

8. The method of claim 5, the supporting substrate is water-proof and comprises a material that is not deformable at a temperature of 20° C. to 75° C.

9. The method of claim 1, wherein a surface of the growth substrate includes a growth inducing layer that is capable of growing the silver nanolines.

10. The method of claim 1, wherein the polymer is transparent and flexible, and has lower electroconductivity than the silver nanolines.

* * * * *